(12) United States Patent
Gammie et al.

(10) Patent No.: US 7,239,204 B2
(45) Date of Patent: Jul. 3, 2007

(54) CURRENT SHUNT INSTRUMENTATION AMPLIFIER WITH EXTENDED BIPOLAR INPUT COMMON MODE RANGE

(75) Inventors: David A. Gammie, Tucson, AZ (US); Edward Mullins, Tucson, AZ (US); Jeffery B. Parfenchuck, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 119 days.

(21) Appl. No.: 11/136,221

(22) Filed: May 24, 2005

(65) Prior Publication Data

US 2006/0267687 A1    Nov. 30, 2006

(51) Int. Cl.
*H03F 3/45* (2006.01)
(52) U.S. Cl. .................. 330/260; 330/258; 330/124 R
(58) Field of Classification Search ................ 330/260, 330/258, 124 R
See application file for complete search history.

(56) References Cited

U.S. PATENT DOCUMENTS

| | | | |
|---|---|---|---|
| 5,418,493 A * | 5/1995 | Dijkmans | 330/253 |
| 5,724,519 A * | 3/1998 | Kato et al. | 345/204 |
| 6,163,217 A * | 12/2000 | Matsubara et al. | 330/255 |
| 6,268,772 B1 * | 7/2001 | Chen | 330/288 |
| 6,552,565 B2 * | 4/2003 | Chang et al. | 326/30 |
| 6,657,486 B2 * | 12/2003 | Kimura | 327/563 |

* cited by examiner

*Primary Examiner*—Patricia Nguyen
(74) *Attorney, Agent, or Firm*—Wade J. Brady, III; Frederick J. Telecky, Jr.

(57) ABSTRACT

An amplifier circuit includes first (7A) and second (7B) operational amplifiers connected in a parallel configuration. A first terminal (12) of a first input resistor (5) is coupled to one input of both of the first (7A) and second (7B) amplifiers. A first terminal (15) of a second input resistor (6) is coupled to another input of both of the first (7A) and second (7B) amplifiers. A differential input voltage is applied between the second terminals of the first and second input resistors. The output signals of the first (7A) and second (7B) operational amplifiers are combined to produce an output signal (11AB) representative of feedback currents produced in the first (5) and second (6) input resistors. Upper and lower common mode input voltage ranges associated with the differential input voltage extend substantially above and below the upper and lower supply voltages, respectively, of the amplifier circuit.

16 Claims, 1 Drawing Sheet

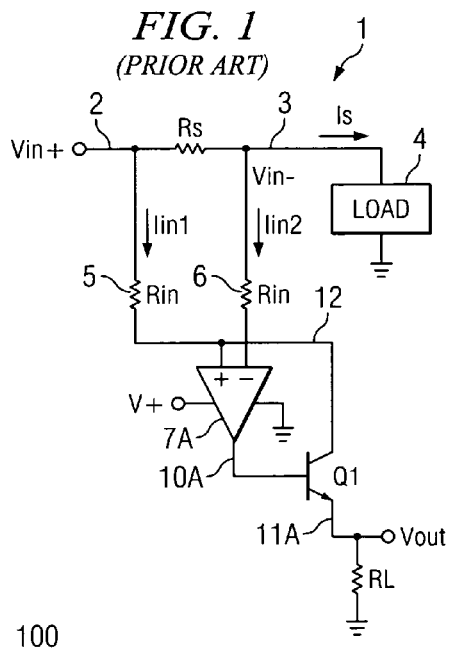
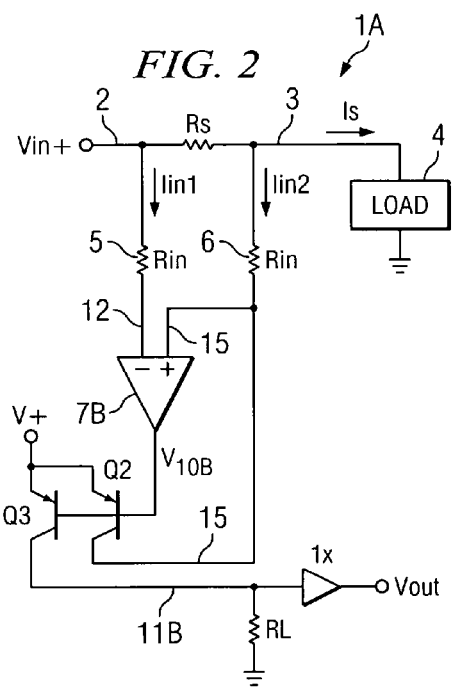
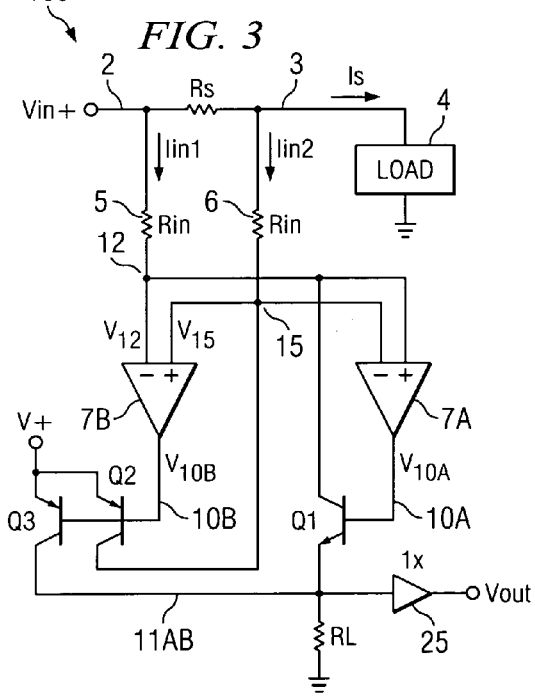
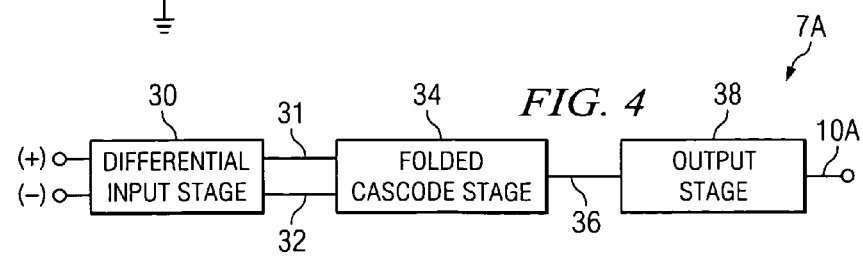

US 7,239,204 B2

CURRENT SHUNT INSTRUMENTATION AMPLIFIER WITH EXTENDED BIPOLAR INPUT COMMON MODE RANGE

BACKGROUND OF THE INVENTION

The present invention relates generally to instrumentation amplifiers, and more particularly to circuitry and techniques for providing accurate instrumentation amplifier operation in both positive and negative portions of a common mode input voltage range.

The closest prior art is believed to be the assignee's INA 168 positive common mode voltage instrumentation amplifier, a simplified diagram of which is shown in FIG. 1. Referring to FIG. 1, prior art instrumentation amplifier 1 has positive common mode voltage operation between a single supply voltage V+ and ground. Amplifier 1 includes an operational amplifier 7A having a (+) input coupled by a conductor 12 to one terminal of a precision input resistor 5, which may, for example, have a resistance Rin equal to 5 kilohms. The other terminal of resistor 5 is coupled by a conductor 2 to receive an input voltage Vin+ and also is connected to one terminal of a "sense" or "shunt" resistor $R_S$, the other terminal of which is connected by a conductor 3 to one terminal of an external load 4, the other terminal of which is connected to ground. Shunt resistor $R_S$ has a very low resistance, typically 10 milliohms to 1 ohm, and a current $I_S$ flows through shunt resistor $R_S$ into load 4 in response to a positive value of Vin+. The current $I_S$ develops a small sense voltage across shunt resistor $R_S$. Conductor 3 is connected to one terminal of another precision input resistor 6, which also has the same resistance Rin. The other terminal of resistor 6 is connected to the (−) input of operational amplifier 7A. Resistor 6 is precisely matched to resistor 5.

The output of operational amplifier 7A is connected by a conductor 10A to the base of an NPN transistor Q1, the emitter of which is connected by an output conductor 11A to one terminal of a load resistor $R_L$, the other terminal of which is connected to ground. The collector of transistor Q1 is connected by conductor 12 to provide feedback to the (+) input of operational amplifier 7A. Positive common mode voltage instrumentation amplifier 1 thus precisely measures the voltage across shunt resistor $R_S$ and produces an output voltage Vout on output conductor 11A, where Vout=$(I_S)(R_S)$ $(R_L)$/Rin. Thus, Vout accurately represents the current $I_S$ supplied to load 4 by Vin+.

The voltage on either conductor 2 or conductor 3 of FIG. 1 can be considered to be the positive common mode voltage. The supply voltage V+ typically has a value in the range from a few volts up to approximately +18 volts. Vin+ can be any value from roughly 1.4 volts to roughly 60 or more volts. The feedback provided by transistor Q1 keeps the voltage difference between the (+) and (−) inputs of operational amplifier 7A at nearly zero, and the current $I_{in2}$ through resistor 6 and hence the resulting voltage drop across it, are essentially zero. Therefore, the voltage across resistor $R_S$ is equal to the voltage developed across 5 kilohm resistor 5. This voltage across resistor 5 produces a current $I_{in1}$ that flows through transistor Q1 and resistor $R_L$.

The common mode voltage on conductor 3 must be positive, because amplifier 7A will turn transistor Q1 off, causing positive common mode voltage instrumentation amplifier 1 to be inoperative if Vin+ is below ground.

There are various applications of positive common mode voltage instrumentation amplifier 1 of prior art FIG. 1, including automotive applications in which both positive and negative transient voltages may occur. However, in such applications, positive common mode voltage instrumentation amplifier 1 may produce undesirable "glitches" in the output voltage Vout.

Thus, there is an unmet need for an instrumentation amplifier which has a wide common mode input voltage range in order to effectively reject a substantial range of both positive and negative transient input voltage spikes.

There also is an unmet need for an instrumentation amplifier which is operative through a wide common mode input voltage range including large-magnitude negative common mode input voltage values substantially lower than the negative supply voltage, and also including large-magnitude positive common mode input voltage values substantially greater than the positive supply voltage.

SUMMARY OF THE INVENTION

It is an object of the invention to provide an instrumentation amplifier which has a wide common mode input voltage range in order to effectively reject a substantial range of both positive and negative transient common mode input voltages.

It is another object of the invention to provide an instrumentation amplifier which is operative through a wide common mode input voltage range including large-magnitude negative common mode input voltage values substantially lower than the negative supply voltage, and also including large-magnitude positive common mode input voltage values substantially greater than the positive supply voltage.

Briefly described, and in accordance with one embodiment, the invention provides an amplifier circuit including first (7A) and second (7B) operational amplifiers connected in a parallel configuration. A first terminal (12) of a first input resistor (5) is coupled to one input of both of the first (7A) and second (7B) amplifiers. A first terminal (15) of a second input resistor (6) is coupled to another input of both of the first (7A) and second (7B) amplifiers. A differential input signal is applied between second terminals of the first and second input resistors. Output signals of the first (7A) and second (7B) operational amplifiers are combined to produce an output signal (11AB) representative of feedback currents produced in the first (5) and second (6) input resistors. The input common mode voltage range of the amplifier extends from substantially below to substantially above the lower and upper power supply voltages of the amplifier circuit.

In a described embodiment, an amplifier circuit (100) includes a first operational amplifier (7A) having a first (+) input, a second (−) input of polarity opposite to the polarity of the first input, and an output (10A), and also includes a second operational amplifier (7B) having a first (+) input, a second (−) input; and an output (10B). A first input resistor (5) has a first terminal (12) coupled to the first (+) input of the first operational amplifier (7A) and the second (−) input of the second operational amplifier (7B). A second input resistor (6) has a first terminal (15) coupled to the second (−) input of the first operational amplifier (7A) and the first (+) input of the second operational amplifier (7B). A differential input voltage is applied between a second terminal (2) of the first input resistor (5) and a second terminal (3) of the second input resistor (6). A first output transistor (Q1) has a control electrode coupled to the output (10A) of the first operational amplifier (7A), a first electrode coupled to a first output conductor (11AB), and a second electrode coupled to the first terminal (12) of the first input resistor (5). A second output transistor (Q2) has a control electrode coupled to the output (10B) of the second operational amplifier (7B), a first electrode coupled to a first supply voltage (V+), and a second electrode coupled to the first terminal (15) of the second input resistor (6). A level translation transistor (Q3) has a control electrode coupled to the output (10B) of the second operational amplifier (7B), a first electrode coupled to the first supply voltage (V+), and a second electrode coupled to the first output conductor (11AB). A load resistor (RL) is coupled between the first output conductor (11AB) and a second supply voltage (GND). The differential input voltage is developed across a shunt resistor (Rs) coupled between the second terminal (2) of the first input resistor (5) and the second terminal (3) of the second input resistor) 6). In a described embodiment of the invention, the first output transistor (Q1) is an NPN transistor and the second output transistor (Q2) and the level translation transistor (Q3) are PNP transistors. The first (5) and second (6) input resistors are precisely matched, and input offset voltages of the first (7A) and second (7B) operational amplifiers are sufficiently matched to avoid unacceptable inaccuracies in the output signal (11AB) during a transition of the differential input signal from a lower portion to an upper portion of its common mode input voltage range.

In another embodiment, an amplifier circuit (1A) includes a differential amplifier (7B) having a first (−) input, a second (+) input, and an output (10B). An output transistor (Q2) has a control electrode coupled to the output (10B) of the differential amplifier (7B). A first electrode is coupled to a first reference voltage (V+), and a second electrode is coupled to the first terminal (15) of the second input resistor (6). A level translation transistor (Q3) has a control electrode coupled to the output (10B) of differential amplifier (7B), a first electrode coupled to the first reference voltage (V+), and a second electrode coupled to a first conductor (11 B). A load resistor (RL) is coupled between the first conductor (11B) and a second reference voltage (GND). A first output voltage is produced on the first conductor (11B).

BRIEF DESCRIPTION OF THE DRAWINGS

FIG. 1 is a schematic diagram of a prior art instrumentation amplifier that is operable only with a positive common mode input voltage.

FIG. 2 is a schematic diagram of an amplifier that is operable throughout an input common mode voltage range which extends from a voltage substantially below a negative supply voltage of the amplifier to a value slightly below a positive supply voltage of the amplifier.

FIG. 3 is a schematic diagram of an instrumentation amplifier structure that is operable for common mode input voltages in a range that extends from substantially below a negative supply voltage of the instrumentation amplifier to substantially above a positive supply voltage of the instrumentation amplifier.

FIG. 4 is simplified block diagram of an operational amplifier suitable for use in the embodiments of FIGS. 2 and 3.

DETAILED DESCRIPTION OF THE PREFERRED EMBODIMENTS

Referring to FIG. 2, instrumentation amplifier 1A includes an operational amplifier 7B having a (+) input connected to conductor 15 and a (−) input connected to conductor 12. Conductor 12 is coupled to one terminal of precision input resistor 5. The other terminal of input resistor 5 is coupled by conductor 2 to receive input voltage Vin+ and also is connected to one terminal of shunt resistor $R_S$, the other terminal of which is connected by conductor 3 to one terminal of external load 4, the other terminal of which is connected to ground. Current $I_S$ flows through shunt resistor $R_S$ into load 4 in response to a positive value of Vin+. The current $I_S$ develops a small sense voltage across shunt resistor $R_S$. Conductor 3 is connected to one terminal of precision input resistor 6, which also has resistance Rin. The other terminal of resistor 6 is connected by conductor 15 to the (−) input of operational amplifier 7B. The output of operational amplifier 7B is connected by conductor 10B to the bases of PNP transistors Q2 and Q3. The emitters of transistors Q2 and Q3 are connected to positive supply voltage V+. The collector of transistor Q2 is connected by conductor 15 to supply feedback to the (+) input of operational amplifier 7B. The collector of level-shifting transistor Q3 is connected to conductor 11B, the output of which produces Vout. The value of Vout is given by the previously mentioned expression Vout=$(I_S)(R_S)(R_L)$/Rin. Transistors Q2 and Q3 function as a current mirror in order to enable transistor Q3 to translate the signal $V_{10B}$ on conductor 10B to lower voltage levels in order to extend the common mode input voltage range of instrumentation amplifier 1A to negative voltages.

As Vin+ increases from the ground supply voltage and approaches the positive supply voltage V+, the relatively small positive voltage developed across shunt resistor Rs by the flow of current Is through it to load 4 causes operational amplifier 7B to produce a sufficiently low voltage $V_{10B}$ on operational amplifier output conductor 10B to maintain output transistor Q2 and level translation transistor Q3 turned on until the voltage on conductor 15 has increased to approximately one emitter-to-base voltage below V+, at which point output transistor Q2 begins to saturate. Instrumentation amplifier 1A becomes highly non-linear with respect to further increases in Vin+, thereby limiting the positive common mode input voltage. Vin+ can decrease to values substantially below ground. Despite its limitations with respect to its positive common mode input range, instrumentation amplifier 1A can be very useful in some applications, for example in some telephone systems.

Thus, a main benefit of the instrumentation amplifier of FIG. 2 is that it provides smooth, un-interrupted operation throughout its entire common mode input voltage range, which can extend from a value substantially below the lower supply voltage GND to a voltage very close to the upper supply voltage V+.

Referring to FIG. 3, instrumentation amplifier 100 includes a generally parallel combination of the structures shown in FIGS. 1 and 2, with instrumentation amplifier 7A having its (−) input connected to conductor 15 and its (+) input connected to conductor 12. Conductor 12 is coupled to one terminal of precision input resistor 5, which may, for example, have a resistance Rin equal to 5 kilohms. The other terminal of resistor 5 is coupled by conductor 2 to receive input voltage Vin+ and also is connected to one terminal of shunt resistor $R_S$, the other terminal of which is connected by conductor 3 to one terminal of external load 4, the other terminal of which is connected to ground. Shunt resistor $R_S$ has a very low resistance, typically 10 milliohms, and current $I_S$ flows through shunt resistor $R_S$ into load 4 in response to a positive value of Vin+. The current $I_S$ develops a small sense voltage across shunt resistor $R_S$. Conductor 3 is connected to one terminal of precision input resistor 6, which also has resistance Rin. The other terminal of resistor 6 is connected by conductor 15 to the (−) input of operational amplifier 7A. The output of operational amplifier 7A is connected by conductor 10A to the base of NPN transistor Q1, the emitter of which is connected by conductor 11AB to load resistor $R_L$. The collector of transistor Q1 is connected to conductor 12 to provide feedback to the (+) input of operational amplifier 7A.

Instrumentation amplifier 100 also includes an operational amplifier 7B having a (+) input connected to conductor 15 and a (−) input connected to conductor 12. The output of operational amplifier 7B is connected by conductor 10B to the bases of PNP transistors Q2, Q3 and Q4. The emitters of transistors Q2, Q3 and Q4 are connected to positive supply voltage V+. The collector of transistor Q2 is connected by conductor 15 to supply feedback to the (+) input of operational amplifier 7B. The collector of transistor Q3, which functions as a level shifter, is connected to conductor 11AB. Conductor 11AB is connected to the input of a unity gain buffer amplifier 14, the output of which produces Vout. The value of Vout is given by the previously mentioned expression Vout=$(I_S)(R_S)(R_L)$/Rin. Transistors Q2 and Q3 function as a current mirror in order to enable level-shifting transistor Q3 to translate the signal $V_{10B}$ on conductor 10B to lower voltage levels in order to extend the common mode input voltage range of instrumentation amplifier 100 to negative voltages that are substantially lower than ground.

Operational amplifiers 7A and 7B preferably have an architecture that includes a differential input stage, a folded cascode stage, and an output stage (which may be a class AB output stage), as shown in FIG. 4. In FIG. 4, operational amplifier 7A includes a differential input stage 30. Differential input stage 30 can include a differentially-coupled pair of N-channel input transistors and/or a pair of differentially coupled P-channel transistors, the drains of which are coupled by conductors 31 and 32, respectively, to inputs of a conventional folded cascode stage 34. Alternatively, differential input stage 30 can include a pair of N-channel input transistors having drains coupled to inputs of folded-cascode circuit 34. As another alternative, differential input stage 30 can include NPN transistors and/or PNP transistors instead of field effect transistors, in which case the respective collectors of the NPN/PNP transistors would be coupled to corresponding inputs of folded cascode circuit 34. In any case, the output 36 of folded cascode circuit 34 is connected to the input of a conventional output circuit 38, the output of which is connected to conductor 10A. The architecture of amplifier 7B can be similar or identical to that of operational amplifier 7A.

Referring again to FIG. 3, if the input offset voltages of operational amplifiers 7A and 7B are sufficiently closely matched, instrumentation amplifier 100 does not produce unacceptable inaccuracies in the output voltage Vout while the common mode input voltage applied to instrumentation amplifier 100 undergoes a transition between its positive and negative ranges.

A main benefit of instrumentation amplifier 100 of FIG. 3 is that it has a large positive and negative common mode input voltage range that extends substantially above and below the upper and lower power supply voltages, respectively, of instrumentation amplifier 100.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. An amplifier circuit comprising:
    (a) a differential amplifier having a first input, a second input , and an output;
    (b) an output transistor having a control electrode coupled to the output of the differential amplifier, a first electrode coupled to a first reference voltage, and a second electrode coupled to the second input;
    (c) a level translation transistor having a control electrode coupled to the output of the differential amplifier, a first electrode coupled to the first reference voltage, and a second electrode coupled to a first conductor; and
    (d) a load resistor having a first terminal coupled to the first conductor and a second terminal coupled to a second reference voltage, a first output voltage being produced on the first conductor;
    wherein the first input is coupled to a first terminal of a first input resistor and the second input is coupled to a first terminal of a second input resistor, a differential input voltage being applied between a second terminal of the first input resistor and a second terminal of the second input resistor.

2. The amplifier circuit of claim 1 wherein the differential input voltage is developed across a shunt resistor coupled between the second terminal of the first input resistor and the second terminal of the second input resistor.

3. The amplifier circuit of claim 2 wherein the differential input voltage developed across the shunt resistor is produced in response to an input voltage applied to the second terminal to cause a shunt current to flow through the shunt resistor into a load.

4. The amplifier circuit of claim 1 wherein resistances of the first and second input resistors are precisely matched.

5. An amplifier circuit comprising:
    (a) first and second amplifiers connected in a parallel configuration;
    (b) first and second input resistance elements, a first terminal of the first input resistance element being coupled to one input of both of the first and second amplifiers, a first terminal of the second input resistance element being coupled to another input of both of the first and second amplifiers, a differential input voltage being applied between a second terminal of the first input resistance element and a second terminal of the second input resistance element; and
    (c) a circuit for combining output signals of the first and second amplifiers to produce an output signal representative of feedback currents produced in the first and second input resistance elements in response to output signals of the first and second amplifiers, respectively.

6. The amplifier circuit of claim 5 wherein the differential input voltage is developed across a shunt resistor coupled between the second terminal of the first input resistance element and the second terminal of the second input resistance element.

7. The amplifier circuit of claim 6 wherein the differential input voltage developed across the shunt resistor is produced in response to an input voltage applied to the second terminal to cause a shunt current to flow through the shunt resistor into a load.

8. The amplifier circuit of claim 7 wherein input offset voltages of the first and second amplifiers are sufficiently closely matched to avoid unacceptable inaccuracies in the output signal during a transition of a common mode input voltage associated with the differential input voltage between upper and lower portions of a common mode input voltage range of the common mode input voltage.

9. An amplifier circuit comprising:
a first operational amplifier having a first input, a second input of polarity opposite to the polarity of the first input, and an output, and a second operational amplifier also having a first input, a second input; and an output;
a first input resistor having a first terminal coupled to the first input of the first operational amplifier and the second input of the second operational amplifier, and a second input resistor having a first terminal coupled to the second input of the first operational amplifier and the first input of the second operational amplifier, a differential input voltage being applied between a second terminal of the first input resistor and a second terminal of the second input resistor, the differential input voltage having an associated a common mode input voltage including an upper range and a lower range;
a first output transistor having a control electrode coupled to the output of the first operational amplifier, a first electrode coupled to a first output conductor, and a second electrode coupled to the first terminal of the first input resistor;
a second output transistor having a control electrode coupled to the output of the second operational amplifier, a first electrode coupled to a first supply voltage, and a second electrode coupled to the first terminal of the second input resistor;
a level translation transistor having a control electrode coupled to the output of the second operational amplifier, a first electrode coupled to the first supply voltage, and a second electrode coupled to the first output conductor; and
a load resistor having a first terminal coupled to the first output conductor and a second terminal coupled to a second supply voltage.

10. The amplifier circuit of claim 9 wherein the differential input voltage is developed across a shunt resistor coupled between the second terminal of the first input resistor and the second terminal of the second input resistor.

11. The amplifier circuit of claim 10 wherein the differential input voltage developed across the shunt resistor is produced in response to an input voltage applied to the second terminal to cause a shunt current to flow through the shunt resistor into a load.

12. The amplifier circuit of claim 9 wherein the first and second output transistors and the level translation transistor are bipolar transistors, wherein each control electrode is a base, each first electrode is an emitter, and each second electrode is a collector.

13. The amplifier circuit of claim 10 wherein the first output transistor is an NPN transistor, wherein the second output transistor and the level translation transistor are PNP transistors.

14. The amplifier circuit of claim 9 wherein the first and second input resistors are precisely matched and wherein input offset voltages of the first and second operational amplifiers are sufficiently closely matched to avoid unacceptable inaccuracies in an output signal produced on the first output conductor during a transition of the common mode input voltage between its upper range and its lower range.

15. The amplifier circuit of claim 9 wherein the first and second operational amplifiers each include a folded cascode stage driven by a differential input stage.

16. The amplifier circuit of claim 15 wherein the first and second operational amplifiers each also include an output stage driven by the folded-cascode stage.

* * * * *